United States Patent
Malladi

(10) Patent No.: US 6,351,389 B1
(45) Date of Patent: Feb. 26, 2002

(54) DEVICE AND METHOD FOR PACKAGING AN ELECTRONIC DEVICE

(75) Inventor: Deviprasad Malladi, Campbell, CA (US)

(73) Assignee: Sun Microsystems, Inc., Mountain View, CA (US)

( * ) Notice: Subject to any disclaimer, the term of this patent is extended or adjusted under 35 U.S.C. 154(b) by 0 days.

(21) Appl. No.: 08/646,426

(22) Filed: May 7, 1996

(51) Int. Cl.[7] .................................................. H05K 1/18
(52) U.S. Cl. ...................... 361/760; 361/767; 361/748; 257/704; 257/737; 257/738; 174/255; 174/260
(58) Field of Search ........................... 361/760, 778, 361/771, 748, 767; 257/778, 704, 737, 738, 712, 713; 174/261, 260, 255

(56) References Cited

U.S. PATENT DOCUMENTS

| | | | |
|---|---|---|---|
| 5,403,784 A | 4/1995 | Hashemi et al. | 437/217 |
| 5,448,114 A | 9/1995 | Kondoh et al. | 257/778 |
| 5,473,512 A | 12/1995 | Degani et al. | 361/760 |
| 5,482,736 A | 1/1996 | Glenn et al. | 427/96 |
| 5,483,421 A | 1/1996 | Gedney et al. | 361/771 |
| 5,484,963 A | 1/1996 | Washino | 174/261 |
| 5,583,378 A * | 12/1996 | Marrs et al. | 257/710 |
| 5,637,920 A * | 6/1997 | Loo | 257/700 |
| 5,831,333 A * | 11/1998 | Malladi et al. | 257/712 |
| 5,901,050 A * | 5/1999 | Imai | 361/820 |
| 6,091,138 A * | 7/2000 | Yu et al. | 257/686 |
| 6,097,609 A * | 8/2000 | Kabadi | 361/760 |

\* cited by examiner

Primary Examiner—Leo P. Picard
Assistant Examiner—David Foster
(74) Attorney, Agent, or Firm—Townsend and Townsend and Crew LLP

(57) ABSTRACT

A method and apparatus for packaging an electronic device, such as an integrated circuit chip (8), includes an intermediate device carrier (6) with a substantially planar upper surface (16) and a plurality of bonding pads (18) for coupling the carrier to the integrated circuit chip. A ceramic ring (38) is attached to the upper surface of the device carrier and a thermally conductive cover plate (36) is attached to the ceramic ring to form an inner cavity for receiving the chip therein. The ceramic ring comprises a material with a coefficient of thermal expansion substantially similar to or as the same as the device carrier to minimize stress therebetween during thermal expansion or contraction of the package device. The thermally conductive cover plate provides a path for dissipating heat generated during electrical operations of the chip.

23 Claims, 1 Drawing Sheet

DEVICE AND METHOD FOR PACKAGING AN ELECTRONIC DEVICE

BACKGROUND OF THE INVENTION

The present invention relates generally to electronic devices and more particularly to methods and devices for packaging semiconductor electronic devices, such as integrated circuit chips.

The packaging of integrated circuit chips for use in computers or similar devices typically involves the attachment of the circuit chips to intermediate device carriers which, in turn, are mounted to a printed circuit board, such as a mother board. The intermediate device carriers are generally considered necessary because of the large difference in the thermal coefficient of expansion between the integrated circuit chip and the printed circuit board. In a particularly well known type of configuration, the chip is mounted onto a ceramic module by "flip-chip" bonding wherein the I/O pads on the face of the chip are bonded to corresponding pads on the module by use of solder bumps or solder balls with solder reflow techniques. The opposite side of the ceramic module is provided with an array of pins or solder bumps which are positioned for insertion into a complementary array of holes or bump contacts on the printed circuit board. The printed circuit board typically includes a plurality of ceramic modules along with a number of interconnected lumped electrical elements, such as capacitors, transformers and resistors, that cannot be conveniently integrated into the chips or modules.

To insulate the integrated circuit chip from dust and other particles, a lid is typically bonded to the carrier device to form an enclosed cavity around the chip. With integrated circuits that are "flip-chip" bonded to the device carrier, heat dissipation paths are generally limited to the bump contacts on the face of the chip since the back of the chip is not in contact with the carrier device or the circuit board. As the contact bumps have become finer, their contact area has grown smaller, limiting the amount of heat dissipation through the bump contacts. To overcome this problem, the lid is typically fabricated from a thermally conducting material, such as metal, for thermally connecting the back side of the circuit chip to a heat sink, thereby allowing dissipation of the heat generated by the integrated circuit chip during electrical operations.

While the above-described technique for connection of integrated circuit chips to printed circuit boards is effective in many instances, it does have several drawbacks and limitations. One such drawback is that the lid and the carrier device typically have substantially different coefficients of expansion when heated. Thus, thermal cycling during electrical operations of the chip will tend to cause undesirable stresses or strains at the lid/module interface, which can lead to material or electrical failure. Material failure at this interface often results in delamination of the adhesive between the lid and module, which causes the lid to separate from the ceramic module.

One attempt to overcome this problem of dissimilar thermal expansion between the lid and the ceramic module is to use compliant adhesives with very low glass transition temperatures to connect the lid to the ceramic module. These compliant materials typically have low moduli and, therefore act as a shock absorber or cushion to absorb the stress resulting from the thermal expansion mismatch between the lid and the ceramic module. Although these compliant adhesives have reduced separation during temperature cycling, the adhesive typically deteriorates at elevated temperatures. Thus, for example, when the module is heated to high temperatures (i.e., on the order of 220° C. to 250° C.) to remove it from the printed circuit board, the compliant adhesive may degrade, allowing the lid to separate from the module.

What is needed, therefore, are improved devices and methods for packaging semiconductor electronic devices, such as integrated circuit chips. These devices and methods should be capable of forming a protective lid over the integrated circuit chip that will remain substantially adhered to the underlying substrate through relatively large temperature changes, such as during chip electrical operations or the component removal process.

SUMMARY OF THE INVENTION

The present invention is directed to a device and method for packaging an electronic device, such as an integrated circuit chip. As used herein, the term "electronic device" includes, but is not limited to, a single semiconductor integrated circuit chip, a multichip module comprising two or more such chips located on and connected to an interconnection substrate, or a composite of one such chip or module that is flip-chip or otherwise bonded to either another such chip or another such module.

The electronic device package of the present invention includes an intermediate device carrier with a substantially planar upper surface and a plurality of electrical attachments for mounting an integrated circuit chip to the device carrier. The package further includes a lid adhered to the upper surface of the intermediate device for housing the circuit chip therein. The lid comprises a first, thermally conductive portion coupled to the electronic device for heat dissipation, and a second portion coupled to the device carrier between the device carrier and the first portion of the lid. The second portion comprises a material having a coefficient of thermal expansion substantially similar to or the same as the device carrier. Matching the thermal expansion characteristics of the lid with those of the device carrier minimizes the stress at the lid/device carrier interface when the package is heated. Consequently, the electrical and mechanical bonds at this interface remain substantially intact during, for example, electrical operations or when the package is heated for removal from the printed circuit board.

In a specific configuration, the second portion of the lid includes a perimetrical support member surrounding the circuit chip and the first portion of the lid comprises an overlying cover plate attached to the support member. The support member is preferably manufactured from the same, or essentially the same, material as the device carrier to maintain the bond therebetween during thermal expansion and contraction of the package device. The cover plate protects the support member. In addition, the cover plate comprises a thermally and electrically conductive portion coupled to the back side of the integrated circuit chip to provide conductive paths for the integrated circuit chip to, for example, overlying electrical elements and/or a heat sink.

In a preferred embodiment, the device carrier comprises a multi-layered ceramic substrate having an array of bump contacts for electrically coupling and mounting the chip to the substrate. In this embodiment, the support member is an annular ceramic ring attached to the ceramic substrate. Preferably, the ceramic ring is manufactured separately from the multi layered ceramic substrate and then laminated to the upper surface of the substrate after the individual layers have been co-fired. With this method of construction, the upper surface of the ceramic substrate within the ceramic ring remains substantially planar after the ring has been attached to the substrate. This facilitates the attachment of the integrated circuit chip to the bump contacts on the substrate.

The cover plate is preferably constructed of a material that has been matched to the thermal expansion characteristics of the support member so that the bond between the plate and the ceramic ring will remain substantially intact during thermal expansion and contraction of the package device. Suitable materials for the cover plate include tungsten, copper, molybdenum or their alloys. The ceramic ring preferably has a height substantially equal to the height of the integrated circuit chip above the ceramic substrate. With this configuration, the cover plate comprises a relatively flat plate attached to the upper surface of the ceramic ring slightly above the circuit chip. This geometry reduces the amount of thermally conductive (i.e., metallic) material required for manufacturing the lid, thereby reducing the overall cost of the package device.

In an exemplary embodiment, a conductive adhesive electrically and thermally couples the inner surface of the cover plate with the integrated circuit chip for connecting the chip to an exterior heat sink and to other overlying electrical elements. The adhesive effectively ensures that the cover plate will remain in contact with the circuit chip during transportation of the chip, thermal cycling, component removal and the like. Since the inner surface of the cover plate extends only slightly above the chip (due to the geometry of the ceramic ring), a minimum amount of conductive adhesive is required to couple the chip to the cover plate, which increases the thermal conductivity therebetween.

The present invention achieves these benefits in the context of known process technology. However, a further understanding of the nature of the advantages of the present invention may be realized by reference to the specification and attached drawings.

DESCRIPTION OF THE SPECIFIC EMBODIMENTS

Figure 1:
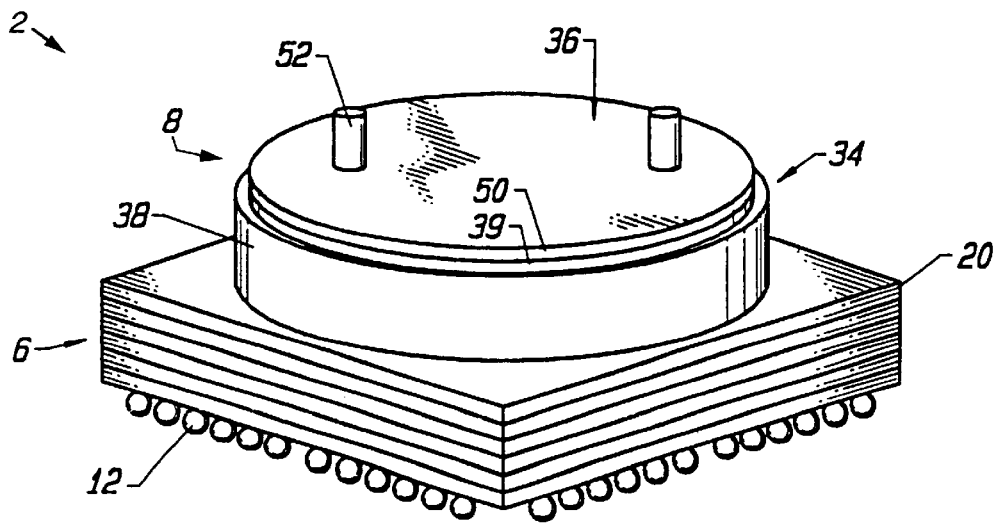
FIG. 1 is a perspective view of an electronic device package according to the present invention.

Referring to the drawings in detail, wherein like numerals indicate like elements, an electronic device package 2 according to the principles of the present invention is illustrated in FIG. 1. Electronic device package 2 generally includes a device carrier comprising a module or substrate 6 having a plurality of electrical mounting contacts 12 for mounting to a circuit board (not shown) and a lid 8 for housing an electronic device, such as a silicon semiconductor integrated circuit chip 10, between the lid 8 and the substrate 6. Lid 8 generally includes a first portion comprising a cover plate 36 and a second portion comprising a perimetrical support member, such as an annular support member 34, wherein the annular support member 34 is coupled to an upper surface 16 of substrate 6 and the cover plate 36 is attached to the support member 34 to enclose chip therein.

Figure 2:
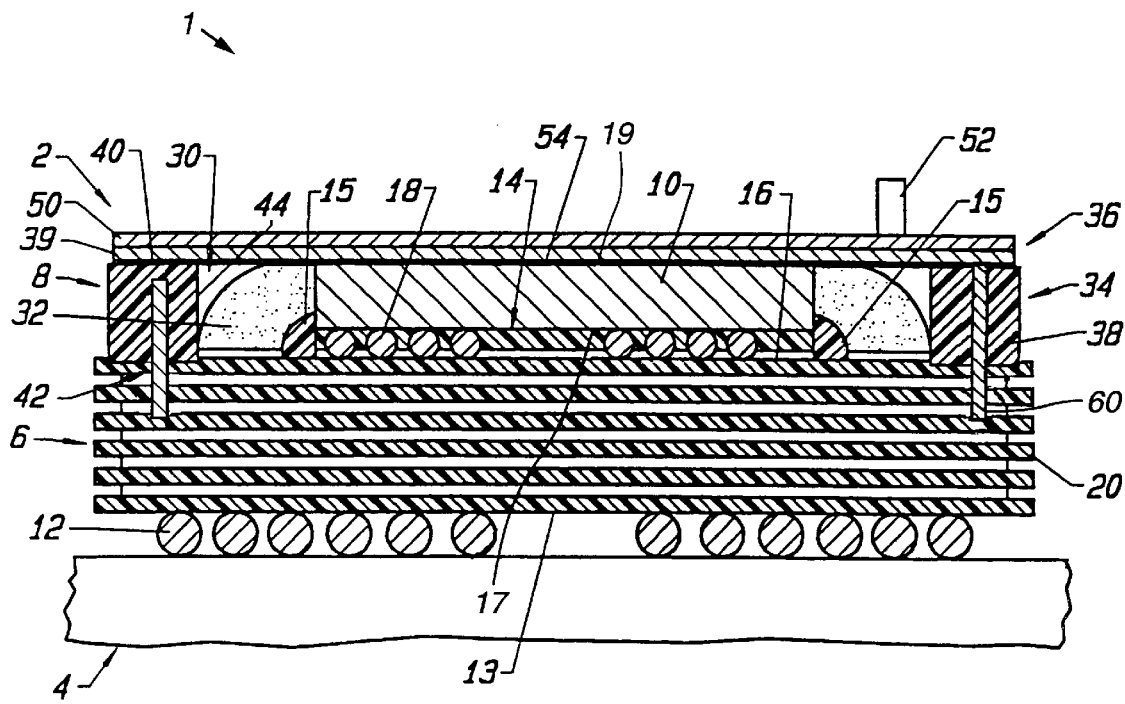
FIG. 2 is a cross-sectional elevational diagram of the electronic device package of FIG. 1, illustrating the package mounted to a representative printed circuit board.

FIG. 2 is a sectional view of electronic device package 2 mounted to a portion of a representative printed circuit board 4, such as a mother board forming part of an electrical circuit board assembly 1. Substrate 6 has an upper surface 16 and a lower surface 13 (The terms "upper" and "lower" are used only to differentiate between the two surfaces, and do not specifically refer to the orientation of the chip or carrier when the structure is mounted on the circuit board, or when the circuit board is mounted in a machine). The lower surface 13 of the substrate is mounted to printed circuit board 4 by electrical mounting contacts 12, such as solder bumps (globules) or pins, on a lower surface 13 of substrate 6 to corresponding contacts (not shown), e.g., bump contacts or holes, on board 4 (note that this connection is only schematically depicted in FIG. 2). The mother board will preferably have a similar coefficient of thermal expansion as substrate 6 and can be made of, for example, aramid, epoxy-glass, or glass-fiber-reinforced epoxy. The mother board typically includes a plurality of modules having one or more integrated circuit chips along with a number of interconnected lumped electrical elements (not shown), such as capacitors, transformers and resistors, that cannot be conveniently (if at all) integrated into the chips or modules.

Integrated circuit chip 10 is supported over upper surface 16 of substrate 6 by a support layer 14 mounted to upper surface 16. Support layer 14 serves to maintain the position of chip 10 at a desired vertical stand-off distance from substrate 6. Support layer 14 is preferably an adhesive layer that forms a fillet 15 around chip 10 for inhibiting lateral motion of chip 10 (especially during assembly). It will, of course, be recognized that the present invention is not limited to this configuration and support layer 14 may comprise, for example, a plurality of spaced blocks or islands distributed between chip 10 and upper surface 16 to separate the chip from substrate 6.

In the illustrative embodiment, chip 10 is "flip-chip" bonded to substrate 6 in a conventional manner. Thus, the "front" surface 17 of chip 10 is electrically connected to substrate 6 and, therefore, disposed below the "back" surface 19 of chip 10. To that end, upper surface 16 of the substrate has one or more mounting elements, such as an array of bonding pads 18 which are arranged in a predetermined pitch and arrangement (i.e., pattern) corresponding to the pattern or footprint of the I/O pads (not shown) on the chip 10. The bonding pads 18 are typically metallized layers having plating layers or solder layers formed thereon. In installation, the integrated circuit chip 10 is placed on substrate 6 such that the I/O pads of chip 10 are soldered to bonding pads 18 of substrate 6 by fusing solder pads previously formed on the terminals of circuit chip 10 or on bonding pads 18 of substrate 6. Of course, chip 10 may be electrically connected to the substrate in a variety of ways other than "flip-chip" bonding; for example, wire bonding, tape automated bonding, or the like.

Substrate 6 is preferably a multi layered ceramic substrate fabricated by forming separate layers of green sheets (not shown) from ceramic powder, such as alumina powder with added organic resin and solvent. A metallic paste mainly composed of, e.g., molybdenum, tungsten, copper, silver or the like, is then S screen printed onto the green sheets to form a pattern of conductive layers on each sheet. Throughholes (not shown) are formed in the green sheets and filled with a metallic paste to interconnect the conductive layers. A plurality of the green sheets are then laminated together and sintered or co-fired. The metallic paste electrically interconnects bonding pads 18 with electrical mounting contacts 14 to connect chip 10 with the printed circuit board 4.

The substrate of the present invention may differ from the substrate described above. For example, substrate 6 can be a single layer and/or it may comprise other materials, such as alumina, glass ceramic, aluminum nitride, mullite or the like. In addition, substrate 6 may be mounted to the mother board by means other than the solder bump (globule) array described above; for example, a plug-in pin grid array (PGA), a column grid array, a dimple grid array, ball grid array (BGA) or the like.

Referring again to FIG. 2, lid 8 and upper surface 16 of substrate 6 define an inner cavity 30 for housing integrated circuit chip 10. The chip is preferably encapsulated by a soft gel medium 32, such as silicone gel, which contacts at least the lateral and bottom surfaces of chip 10. As used here, the term "soft" refers to the Young's modulus of the gel medium that is sufficiently low (generally less than 100 psi) to enable sliding of the front surface 17 of chip 10 along bonding pads 18 during thermal cycling of chip 10.

As shown in FIG. 2, lid 8 comprises an annular support member 34 attached to upper surface 16 of substrate 6, and a cover plate 36 attached to support member 34 to enclose chip 10 within cavity 30. Support member 34 preferably comprises a ceramic ring 38 composed of, for example, aluminum oxide. Ceramic ring 38 has generally planar upper and lower surfaces 40, 42 and a perimetrical inner surface 44 that defines inner cavity 30 and circumscribes integrated circuit chip 10. Since ceramic ring 38 comprises the same or substantially the same material as substrate 6, it will have the same or substantially the same coefficient of thermal expansion. Ring 38 and substrate 6 will both usually have a thermal expansion coefficient of about 6.3 ppm. Thus, when the temperature of ceramic ring 38 and substrate 6 rises due to heat generated by the chip during electronic operations or when package 2 is externally heated during removal of substrate 6 from circuit board 4, thermal stress at the substrate/ring 38 interface is minimized. Consequently, ceramic ring 38 will generally remain substantially attached to substrate 6 during electronic operations and throughout the component removal process.

In a preferred configuration, ceramic ring 38 is manufactured separately from ceramic substrate 6 and then laminated to upper surface 16 of substrate 6 after the individual layers have been co-fired. With this method of construction, the upper surface 16 of substrate 6 within ceramic ring 38 will remain substantially planar after ring 38 has been attached to substrate 6. This facilitates the attachment of integrated circuit chip 10 to substrate 6. Of course, ceramic ring 38 may be integrally formed with substrate 6 by, for example, co-firing the ring 38 together with the green sheet layers 20. However, applicant has found that this method of construction may cause surface 16 of substrate 10 to bow outward, thereby making it more difficult to mount circuit chip 10 to substrate 6.

As shown in FIG. 2, cover plate 36 preferably comprises a thermally conductive, generally planar plate 39 that is bonded by means of a pliant adhesive epoxy layer (not shown) onto upper surface 40 of ceramic ring 38. The epoxy layer preferably has a relatively low glass transition temperature, e.g., about 45° C., and is bonded to ring 38 and plate 36 by heating it to a temperature above its glass transition temperature. Conductive plate 39 will usually comprise a material whose thermally expansion characteristics can be matched with those of ceramic ring 38, such as tungsten, molybdenum or combinations thereof. In a preferred configuration, plate 39 will comprise a tungsten/copper alloy having a coefficient of thermal expansion of about 7.0 to 7.3 ppm.

As shown in FIGS. 1 and 2, a layer of conductive epoxy 50 is preferably formed over the upper surface of conductive plate 39. A plurality of mounts 52 are then attached to epoxy layer 50 and spaced from each other for attaching a heat sink (not shown) to package 2. Conductive plate 39 is preferably grounded through ceramic ring 38 by one or more electrical contacts 60 to reduce noise when carrier device 6 is attached to board 4. Conductive plate 39 is thermally and electrically coupled to the back surface 19 of integrated circuit chip 10 by an adhesive layer 54, such as epoxy, polyimide, silicone or other die attach adhesives. Plate 39, adhesive layer 54 and epoxy 50 provide an electrical connection between chip 10 and any overlying electrical elements. These elements provide thermal conduction that allows heat produced by chip 10 during electrical operations to dissipate to the heat sink.

Minimizing the thickness of adhesive layer 54 between conductive plate 39 and chip 10 increases the thermal conductivity between plate 39 and chip 10. To accomplish this, ceramic ring 38 will preferably have a height substantially equal to the height integrated circuit chip 10 extends above substrate 6 (i.e., the height of both chip 10 and support layer 14). Usually, ring 38 will have a height of about 2 to 5 mils less than the height of chip 10 and support layer 14. With this configuration, conductive plate 39 is a substantially flat plate that almost contacts chip 10 when plate 39 is mounted onto ring 38 so that a relatively thin adhesive layer 54, i.e., on the order of about 2 to 3 mils, can be applied between plate 39 and chip 10. This layer 54 effectively ensures that the chip 10 remains in electrical contact with plate 39, while allowing chip 10 to dissipate heat through layer 54 and plate 39 to a heat sink (not shown) above package device 2.

While the above is a full description of the specific embodiments, various modifications, alternative constructions and equivalents may be used. For example, while the description above is in terms of a multi layered ceramic device carrier, the invention may be used with other types of substrates, such as FR4, BT or polyimide. The mother board 4 may also be omitted and all access circuitry can then be located on or in substrate 6.

In addition, it should be noted that the invention is not limited to an annular ceramic support member as described above and illustrated in FIGS. 1 and 2. For example, support member 34 does not have to completely surround the chip 10 and may comprise a variety of shapes other than annular, such as rectangular, square, C-shaped, etc. Alternatively, the entire lid 8 may be formed from support member 34 and the circuit chip 10 may be coupled to the heat sink by other means. In addition, support member 34 may comprise other materials that are substantially matched for thermal expansion with substrate 6. For example, with the representative ceramic substrate, support member 34 may comprise tungsten, molybdenum or their alloys.

What is claimed is:

1. An electronic device package comprising:
    a device carrier defining an upper surface with one or more mounting elements for electrically coupling the device carrier to an electronic device;
    an electronic device coupled to the mounting elements; and
    a lid attached to the upper surface of the device carrier and housing the electronic device between the lid and the device carrier, the lid comprising a first portion, thermally conductively coupled to the electronic device, and a second portion extending between the device carrier and the first portion, the second portion comprising a material having a coefficient of thermal expansion substantially similar to or the same as at least the upper surface of the device carrier, wherein the second portion of the lid comprises a perimetrical support member attached to the upper surface of the device carrier.

2. The package of claim 1 wherein the first portion of the lid comprises an electrically conductive cover plate attached to the perimetrical support member.

3. The package of claim 2 wherein the perimetrical support member comprises the same material as the device carrier.

4. The package of claim 2 wherein the device carrier comprises a multi layered ceramic substrate.

5. The package of claim 4 wherein the perimetrical support member comprises an annular ceramic ring.

6. The package of claim 5 wherein the ceramic ring was manufactured separately from the multi layered ceramic substrate and was then laminated to the multi layered ceramic substrate.

7. The package of claim 5 wherein the ceramic ring was integrally formed with the multi layered ceramic substrate.

8. The package of claim 2 wherein the cover plate is a substantially flat plate comprising a material having a coefficient of thermal expansion substantially similar to or the same as the perimetrical support member.

9. The package of claim 2 wherein the cover plate comprises a material selected from the group consisting essentially of copper, tungsten, molybdenum and combinations thereof.

10. The package of claim 2 wherein the cover plate is laminated to an upper surface of the perimetrical support member.

11. The package of claim 2 wherein the cover plate is thermally and electrically coupled to the electronic device.

12. The package of claim 1 wherein the electronic device is an integrated circuit and the mounting elements are metallized bonding pads adapted for electrical connection to bump contacts on the integrated circuit.

13. The package of claim 1 wherein the electronic device is a flip-chip type integrated circuit.

14. A semiconductor device comprising:
   a device carrier defining a substantially planar upper surface with a plurality of electrical mounting elements;
   an electronic device having a front side with a plurality of contacts extending therefrom and coupled to the electrical mounting elements of the device carrier; and
   a lid defining an inner cavity enclosing the electronic device therein, the lid comprising a perimetrical support member adhered to the upper surface of the device carrier and a cover plate adhered to the support member and coupled to the electronic device, the support member comprising a material having a coefficient of thermal expansion substantially similar to or the same as at least the upper surface of the device carrier, the cover plate comprising an electrically conductive material.

15. A circuit board assembly comprising:
   a circuit board;
   at least one device carrier electrically mounted on the circuit board, the device carrier defining an upper surface;
   an electronic device electrically mounted on the upper surface of the device carrier; and
   a lid attached to the device carrier and housing the electronic device between the lid and the device carrier, the lid comprising a first portion, thermally and electrically conductively coupled to the electronic device, and a second portion extending between the device carrier and the first portion, the second portion comprising a material having a coefficient of thermal expansion substantially similar to or the same as the device carrier,
   wherein the second portion of the lid comprises a perimetrical support member attached to the upper surface of the at least one device carrier.

16. A method for packaging an electronic device comprising:
   electrically mounting a front side of an electronic device on an upper surface of a device carrier; and
   adhering a lid to the upper surface of the device carrier to house the electronic device therein, a portion of the lid comprising a material having a coefficient of thermal expansion substantially similar to or the same as the device carrier,
   wherein the portion of the lid comprising the material having a coefficient of thermal expansion substantially similar to or the same as the device carrier comprises a perimetrical support member and the lid further comprises an electrically conductive cover plate, the adhering step comprising forming the perimetrical support member on the upper surface of the device carrier and mounting the electrically conductive cover plate on the perimetrical support member.

17. The method of claim 16 wherein the lid comprises a thermally conductive portion and the method further comprises:
   thermally coupling the electronic device to the thermally conductive portion of the lid; and
   dissipating heat from the electronic device through the thermally conductive portion of the lid.

18. The method of claim 16 wherein the device carrier comprises a multi-layered ceramic substrate and the method comprises forming a plurality of ceramic layers and laminating the layers together to form the multi-layered ceramic substrate.

19. The method of claim 18 which further includes co-firing the ceramic layers together.

20. The method of claim 19 wherein the perimetrical support member is in the form of an annular ceramic ring, the method further comprising laminating the annular ceramic ring to one of the ceramic layers and co-firing the annular ceramic ring with the ceramic layers.

21. The method of claim 19 wherein the perimetrical support member is in the form of an annular ceramic ring, the method further comprising laminating the annular ceramic ring to one of the ceramic layers after the co-firing step.

22. The method of claim 16 wherein the cover plate comprises a material having a coefficient of thermal expansion substantially similar to the perimetrical support member and the method further comprises electrically coupling the cover plate to the electronic device.

23. The method of claim 16 wherein the electronic device comprises an integrated circuit chip and the electrically mounting step comprises:
   positioning bump contacts formed on the integrated circuit chip onto electrical mounting elements formed on the device carrier; and
   soldering the bump contacts to the mounting elements.

* * * * *